(12) United States Patent
Heberlein et al.

(10) Patent No.: US 10,459,051 B2
(45) Date of Patent: Oct. 29, 2019

(54) FIELD OF VIEW INCREASE IN MAGNETIC RESONANCE IMAGING USING NONLINEAR GRADIENTS AND GENERALIZED ITERATIVE RECONSTRUCTION

(71) Applicants: Siemens Healthcare GmbH, Erlangen (DE); The General Hospital Corporation, Boston, MA (US)

(72) Inventors: Keith Aaron Heberlein, Charlestown, MA (US); Jason Stockmann, Cambridge, MA (US)

(73) Assignees: Siemens Healthcare GmbH, Erlangen (DE); The General Hospital Corporation, Boston, MA (US)

( * ) Notice: Subject to any disclaimer, the term of this patent is extended or adjusted under 35 U.S.C. 154(b) by 227 days.

(21) Appl. No.: 15/399,015

(22) Filed: Jan. 5, 2017

(65) Prior Publication Data
US 2018/0188342 A1    Jul. 5, 2018

(51) Int. Cl.
*G01V 3/00* (2006.01)
*G01R 33/48* (2006.01)
*G01R 33/565* (2006.01)

(52) U.S. Cl.
CPC ... *G01R 33/4824* (2013.01); *G01R 33/56572* (2013.01); *G01R 33/481* (2013.01)

(58) Field of Classification Search
CPC .............. G01R 33/543; G01R 33/5659; G01R 33/3415; G01R 33/36; A61B 5/055
USPC ......................................................... 399/309
See application file for complete search history.

(56) References Cited

U.S. PATENT DOCUMENTS

| | | | | |
|---|---|---|---|---|
| 6,278,275 B1* | 8/2001 | Petropoulos | ......... | G01R 33/385 324/309 |
| 6,377,043 B1* | 4/2002 | Aldefeld | ............ | G01R 33/3852 324/307 |
| 2006/0226836 A1* | 10/2006 | Shu | ........................ | G01R 33/54 324/309 |
| 2012/0235681 A1* | 9/2012 | Stemmer | ............ | G01R 33/4835 324/307 |
| 2014/0361770 A1* | 12/2014 | Dannels | ............. | G01R 33/5611 324/309 |
| 2016/0070023 A1* | 3/2016 | Herrmann | ............ | G01V 99/005 702/14 |

OTHER PUBLICATIONS

Blumhagen J. O. et al; "MR-Based Field-of-View Extension in MR/PET: B0 Homogenization Using Gradient Enhancement (HUGE)"; Magnetic Resonance in Medicine; vol. 70; pp. 1047-1057.

(Continued)

*Primary Examiner* — Clayton E. LaBalle
*Assistant Examiner* — Frederick Wenderoth

(57) ABSTRACT

A method for increasing field of view (FOV) in magnetic resonance imaging includes determining linear field gradients of associated with a gradient coil of a magnetic resonance (MR) scanner and using the MR scanner to acquire a k-space dataset representative of a patient using a plurality of readout gradient amplitudes. An extended FOV image is generated based on the k-space dataset using an iterative reconstruction process to solve a forward model that incorporates a measurement of gradient distortion as a deviation from the linear field gradients.

20 Claims, 5 Drawing Sheets

(56) References Cited

OTHER PUBLICATIONS

Stockmann JP et al. : "O-Space Imaging: Highly Efficient Parallel Imaging Using Second-Order Nonlinear Fields as Encoding Gradients with no Phase Encoding", Magn. Reson. Med, 2010, 64, pp. 447-456.

Stockmann, Jason P., et al. "In vivo O-Space imaging with a dedicated 12 cm Z2 insert coil on a human 3T scanner using phase map calibration." Magnetic resonance in medicine 69.2 (2013): 444-455.

Gallichan D et al: "Simultaneously Driven Linear and Nonlinear Spatial Encoding Fields in MRI", Magn. Reson. Med, 2011, 65, 702-714.

Hennig, Juergen, et al. "Parallel imaging in non-bijective, curvilinear magnetic field gradients: a concept study." Magnetic Resonance Materials in Physics, Biology and Medicine 21.1-2 (2008): 5-14.

Herman, Gabor T., and Arnold Lent. "Iterative reconstruction algorithms." Computers in biology and medicine 6.4 (1976): 273-294.

\* cited by examiner

FIELD OF VIEW INCREASE IN MAGNETIC RESONANCE IMAGING USING NONLINEAR GRADIENTS AND GENERALIZED ITERATIVE RECONSTRUCTION

TECHNOLOGY FIELD

The present invention relates generally to methods, systems, and apparatuses for increasing field of view in magnetic resonance imaging using nonlinear gradients and generalized iterative reconstruction. The disclosed technology may be applied to, for example, the generation of full body models for use in positron emission tomography (PET) scanning.

BACKGROUND

In Magnetic Resonance (MR) imaging applications, the term field-of-view (FOV) refers the distance over which an image is acquired or displayed. Recently, a MR acquisition technique has been proposed for extending the FOV by implementing an MR sequence that uses a readout gradient field to compensate $B_0$ field inhomogeneity and gradient nonlinearities. The method, called $B_0$ homogenization using gradient enhancement (HUGE), can be applied in the readout direction in which the distortions depend on both the gradient nonlinearities and on the $B_0$ inhomogeneity (as opposed to the phase-encoding direction in which they depend only on the gradient nonlinearities). HUGE allows the extension of the FOV to 60 cm (i.e., equal to the bore size of a typical MR scanner).

There were several limitations of the HUGE technique. For example, the optimal readout gradient must be determined for each side of the subject (i.e., left and right arm) at each bed position. This substantially increases the total acquisition time. Moreover, the typical gradient linearity region for a clinical system is 50 cm, which truncates the arms of the patient and, in the case of large body habitus, large regions of the anatomy. Generating images of these truncated portions of the anatomy can be critical to both calibration and reference scans which rely on patient specific settings, such as parallel transmit MR and simultaneous MR-PET. Generating images of these truncated portions of the anatomy can be critical to both calibration and reference scans which rely on patient specific settings, such as parallel transmit MR, simultaneous MR-PET and radiation oncology therapy planning. Hybrid applications that combine modalities require accurate patient specific body models that account for the correct anatomical positioning in the MR scanner. Specifically, for advanced parallel transmit pulse design, local SAR deposition depends greatly on patient specific anatomy. It is a similar case with radiation therapy planning where the dose strategy is modulated by the patient's tissue structure. The PET imaging example focusing on the reverse problem where radiation coming from the body is attenuated by the surrounding tissue.

SUMMARY

Embodiments of the present invention address and overcome one or more of the above shortcomings and drawbacks, by providing methods, systems, and apparatuses related to increasing FOV in magnetic resonance imaging using nonlinear gradients and generalized iterative reconstruction. Briefly, the techniques described herein sample the gradient nonlinearity over a plurality of different projections and reconstruct the resulting k-space data using an algorithm that takes into account the known measurements of the gradient fields present in the scanner.

According to some embodiments, method for increasing field of view (FOV) in magnetic resonance imaging includes determining linear field gradients of associated with a gradient coil of a MR scanner and using the MR scanner to acquire a k-space dataset representative of a patient using a plurality of readout gradient amplitudes. An extended FOV image is generated based on the k-space dataset using an iterative reconstruction process to solve a forward model that incorporates a measurement of gradient distortion as a deviation from the linear field gradients.

Various enhancements, refinements, or other modifications may be made to the aforementioned method in different embodiments of the present invention. For example, in some embodiments, the MR scanner acquires the k-space dataset using multiple projections of a non-Cartesian trajectory (e.g., a spiral sampling trajectory or a radial sampling trajectory). In one embodiment, the linear field gradients of associated with the gradient coil of the MR scanner comprise spatially varying functions. In some embodiments, the iterative reconstruction process comprises a process implementing the Kaczmarz algorithm. The method may also further include generating a full body model of the patient based on the extended FOV image and using the full body model to perform a PET reconstruction of a patient image.

According to other embodiments of the present invention, a system for increasing FOV in magnetic resonance imaging includes a plurality of coils and a control computer. The coils are configured to acquire a k-space dataset representative of a patient using a plurality of readout gradient amplitudes. The control computer is configured to reconstruct an extended FOV image of the patient based on the k-space dataset using a process which includes determining linear field gradients associated with the coils, and generating the extended FOV image based on the k-space dataset using an iterative reconstruction process to solve a forward model that incorporates a measurement of gradient distortion as a deviation from the linear field gradients.

In some embodiments of the aforementioned system, the coils acquire the k-space dataset using multiple projections of a non-Cartesian trajectory. In one embodiment, the coils are volume coils. In another embodiment, the coils comprise a phased array of coils and generation of the extended FOV image utilizes a plurality of sensitivity maps associated with the plurality of coils. Additionally, the linear field gradients of associated with the coils may comprise a plurality of spatially varying functions.

Some embodiments of the aforementioned system further include a computer configured to generate a full body model of the patient based on the extended FOV image. Additionally, the system may include a positron emission tomography (PET) scanner configured to perform a PET acquisition of the patient using the full body model.

According to other embodiments, a system for performing extended FOV imaging comprises a MM scanner that is configured to acquire a k-space dataset representative of a patient using a plurality of readout gradient amplitudes. The system further includes one or more computers that are configured to generate an extended FOV image based on the k-space dataset using an iterative reconstruction process to solve a forward model that incorporates a measurement of gradient distortion as a deviation from linear field gradients associated with the MRI scanner. The computers also generate a full body model of the patient based on the extended FOV image. Additionally, the system includes a PET scanner configured to perform a PET acquisition of the patient using the full body model. In some embodiments of the system, the MRI scanner and the PET scanner are co-located in a single hybrid scanning device.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to increasing field of view in magnetic resonance imaging using nonlinear gradients and generalized iterative reconstruction. Gradient linearity is of critical importance to the quality and fidelity of the MR image. Improved gradient design that created regions of high linearity comes at a significant cost to the system. Additionally, a large linear field gradient also induces currents in the peripheral nerves of the patient. Relaxing the gradient linearity condition could lead to higher performance gradient systems that overcome physiological effects of the image encoding in Magnetic Resonance Imaging (MRI) in addition to extension of the useable clinical field of view.

Figure 1:
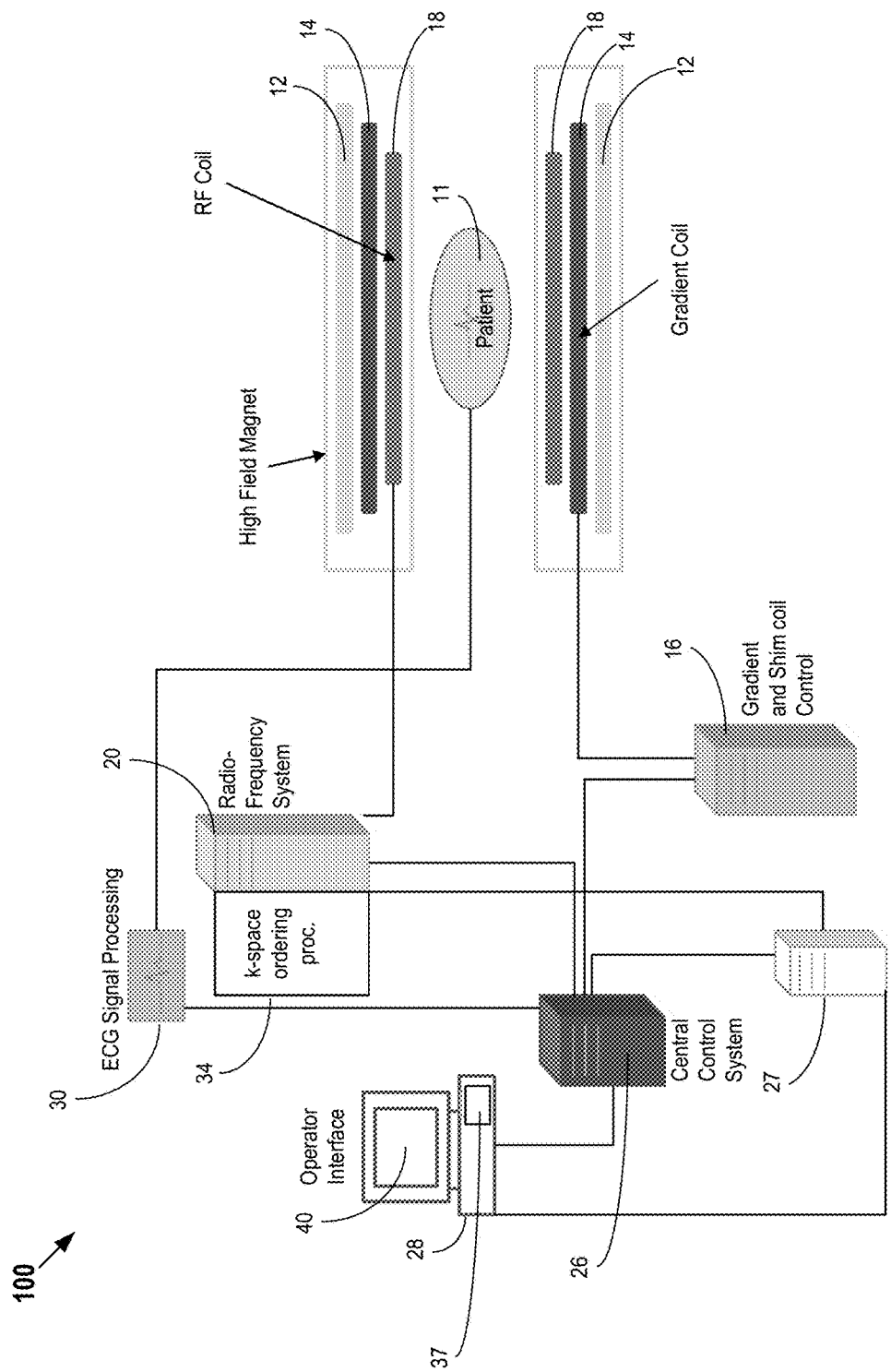
FIG. 1 shows a system for ordering acquisition of frequency domain components representing magnetic resonance image data for storage in a k-space storage array, as used by some embodiments of the present invention.

FIG. 1 shows a system 100 for ordering acquisition of frequency domain components representing MRI data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further radio frequency (RF) system 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF system 20, as directed by central control system 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF system 20 and k-space ordering proc. 34 to provide a magnetic resonance dataset to an image data processor for processing into an image. In some embodiments, the image data processor is located in central control system 26. However, in other embodiments such as the one depicted in FIG. 1, the image data processor is located in a separate unit 27. Electrocardiography (ECG) signal processing 30 provides ECG signals used for pulse sequence and imaging synchronization. A two or three dimensional k-space storage array of individual data elements in k-space ordering proc. 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of a magnetic resonance dataset representing an magnetic resonance image. A storage processor in the k-space ordering proc. 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control system 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control system 26 and enables user modification of magnetic resonance imaging signals in substantially real time. Continuing with reference to FIG. 1, display processor 37 processes the magnetic resonance signals to reconstruct one or more images for presentation on display 40, for example. Various techniques may be used for reconstruction. For example, as described in greater detail below, an optimization algorithm is applied that iteratively solves a forward model which incorporates the plurality of spatially varying functions.

Figure 2:
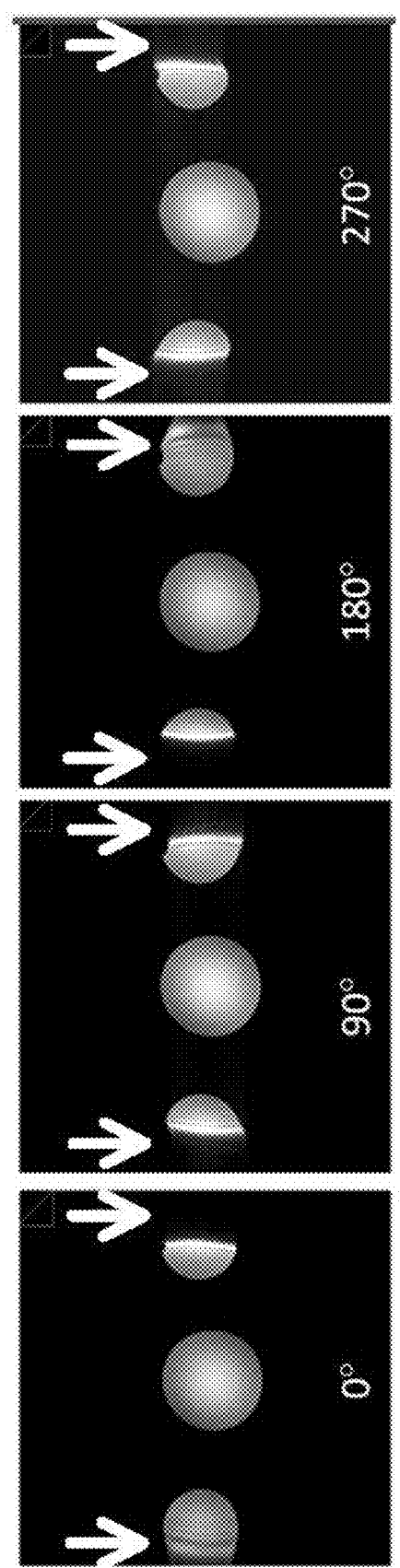
FIG. 2 shows four phantom images acquired with a fast gradient echo imaging sequence and a 60 cm FOV.

To address the issue of geometrically accurate imaging in non-linear fields, the techniques described directly reconstruct MR images from radial projections and measurements of gradient non-linearity. FIG. 2 shows four phantom images (2D gradient echo, 3 mm isometric, 1.2 sec per radial view) acquired with a fast gradient echo imaging sequence and a 60 cm FOV. Three phantoms were placed in the bore of the MM scanner: one at isocenter and two at the extremes in order to simulate the position of a patient's arms. The series of images show modulation of distortions artifacts (white arrows) by stepping through different radial views. Thusly radial acquisition can sample the gradient nonlinearity in different projections, motivating a k-space reconstruction that takes into account the known measurements of the gradient fields.

Using the techniques described herein images are reconstructed from k-space datasets using a generalized iterative approach that explicitly considers the presence of gradient non-linearity. More specifically, the reconstruction strategy employed herein writes the forward model of MR signal generation considering non-linear fields and iteratively solves the model using the Kaczmarz method. This proven approach will be a simplification the reconstruction used in O-space imaging, as coil sensitivity profiles will be neglected (especially in the case of whole body imaging may require the use of the body coil for imaging). The method describe herein is not inherently restricted to volume coil acquisitions and is extendable to phased array reception as long as coil sensitivity maps are available and coil coverage of the anatomy is sufficient for whole body imaging.

As is generally understood in the art, the Kaczmarz method is an iterative row-action back-projection algorithm which may be applied to obtain an image estimate when a forward model is described by a large system of equations in the form of an encoding matrix. The term "forward model" refers to a description of the transformation from the image space of a scanned object to the projection space for a scanned object, after the acquisition of the data by the MM imaging system. The forward model with radial projection views can be written in two dimensions for a transaxial slice at isocenter as follows:

$$m(G_x, G_y, t) = \int \rho(x,y) e^{-i\gamma \int_0^t (xG_x + yG_y + \Delta G_{(x,y)}) dt} dx dy \quad (1)$$

noting the gradient distortion as a deviation from linear field gradients $G_x$, $G_y$. In the case of linear field gradients the standard spin warp k-space formulation is achieved.

In Equation 1, the acquired signal, represented by m, is a function of the gradients that are applied $G_x$, $G_y$ and time t. This is acquired by creating an echo in time subject to these echo pulses. It should be noted that Equation 1 assumes two-dimensional gradients for simplicity; however, the general concept can be extended to a third dimension. On the right side of Equation 1, an integral is taken over the object p, which is a function of x, y in real space. In the exponential portion of the equation, y is the geometric ratio. The gradients $G_x$, $G_y$ are used as phase factors for each given point in space and time. If there were perfectly linear gradients, only the $xG_x$ and $yG_y$ would need to be considered and a simply Fourier reconstruction can be performed to reconstruct the data. However, to consider non-linear gradients, Equation 1 adds the term $\Delta G_{(x,y)}$, which captures all possible gradient non-linearities. The term $\Delta G_{(x,y)}$ may be represented, for example, as a spatially varying function with parameters x and y. The reconstruction will then try to find a solution to these terms as best it can, in the least squares sense. Equation 1 replaces the Fourier Transforms performed with conventional iterative reconstruction techniques. Other aspects of the reconstruction pipeline as generally understood in the art (e.g., coil combinations, converting from complex to real values, etc.) would be performed the same as in conventional techniques.

Since image distortion due to nonlinear fields depends on the readout gradient strength, a method that steps through multiple readout gradient amplitudes and radial projections provides the encoding to solve the algebraic reconstruction in Equation 1. Using the known field measurements of the gradient coil in the MR scanner, geometrically accurate images may be the extended FOV are reconstructed.

Figure 3:
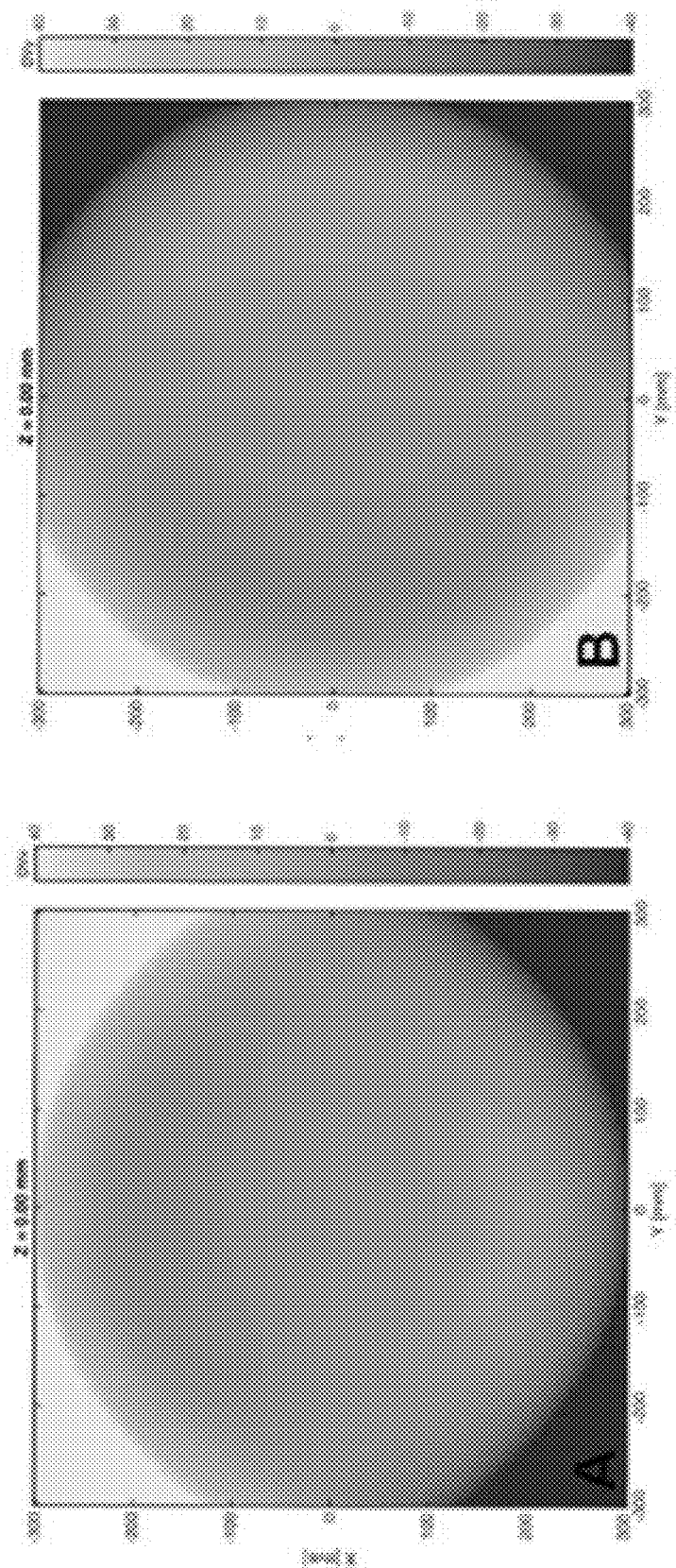
FIG. 3 provides an example of the sum of linear field terms plus the non-linear terms through a slice in the center of the bore.

The linear field terms for a scanner are generally supplied by the scanner manufacturer. FIG. 3 provides an example of the sum of linear field terms plus the non-linear terms through a slice in the center of the bore. This example demonstrates the strong falloff in linearity near the edges of a 60 cm FOV in terms of pixel displacement. In the region of the arms the displacements are in the range of 30 to 40 mm causing the severe distortions shown in FIG. 2.

Figure 4:
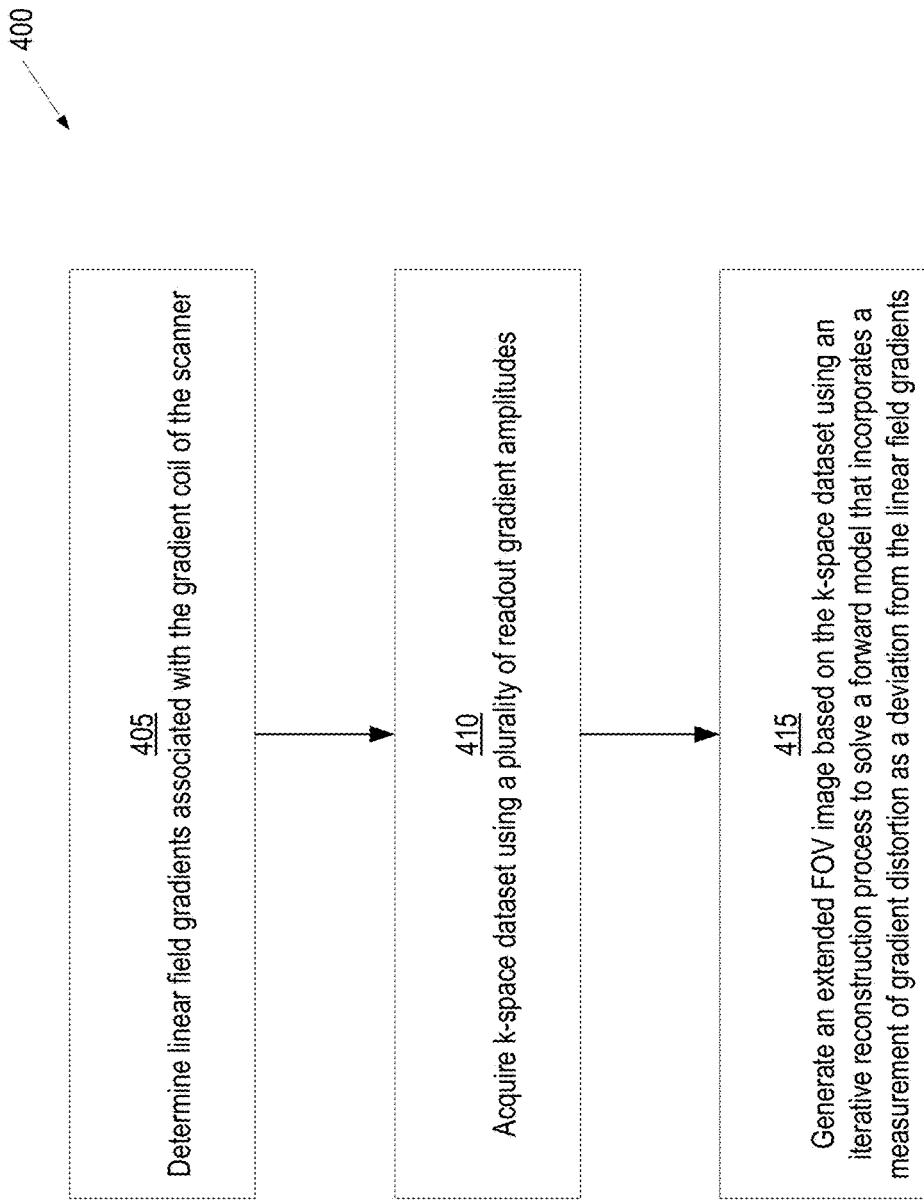
FIG. 4 provides an overview of a method for increasing FOV in MR imaging, according to some embodiments.

FIG. 4 provides an overview of a method 400 for increasing FOV in MR imaging, according to some embodiments. Starting at step 405, the linear field gradients associated with the gradient coil of the scanner are determined. These field gradients may be specified, for example, using a plurality of spatially varying functions. The functions may comprise second order, third order, or even higher-order functions. Each function may be defined based on sampling of the MR scanner; however, in general, the functions can be specified by the manufacturer of the MR scanner. Thus, the step of determining the field gradients at 405, may include actions such as the MR scanner reading the linear field gradients from a file or the MR scanner receiving the manual input for the linear field gradients from an operator.

Next, at step 410, the MR scanner is used to acquire a k-space dataset representative of a patient using a plurality of readout gradient amplitudes. A Cartesian trajectory may be used to acquire the k-space dataset; however, this may not remove all of the distortions caused by non-linear gradient fields. Thus, to provide optimal results, in some embodiments, the MR scanner acquires the k-space dataset using multiple projections of a non-Cartesian trajectory such as a radial sampling or a spiral sampling trajectory.

Then, at step 415, an extended FOV image is generated based on the k-space dataset using an iterative reconstruction process to solve a forward model that incorporates a measurement of gradient distortion as a deviation from the linear field gradients. This iterative reconstruction process may implement the Kaczmarz algorithm or any other similar technique generally known in the art for reconstructing image data based on forward model of the underlying data.

Once the extended FOV image has been acquired it may be analyzed directly or, in some embodiments, it may be used as input to other image processing tasks. For example, in some embodiments, the extended FOV image may be used to generate a whole body model of the patient, using techniques generally known in the art. This whole body model may then be used as input to image acquisition tasks involving other image modalities. For example, in one embodiment, the whole body model is used as input to a positron emission tomography (PET) scanner. This PET scanner may be separate from the MRI scanner used to produce the extended FOV image or, in some instances, the PET scanner and MM scanner can be combined in a single, hybrid device.

Figure 5:
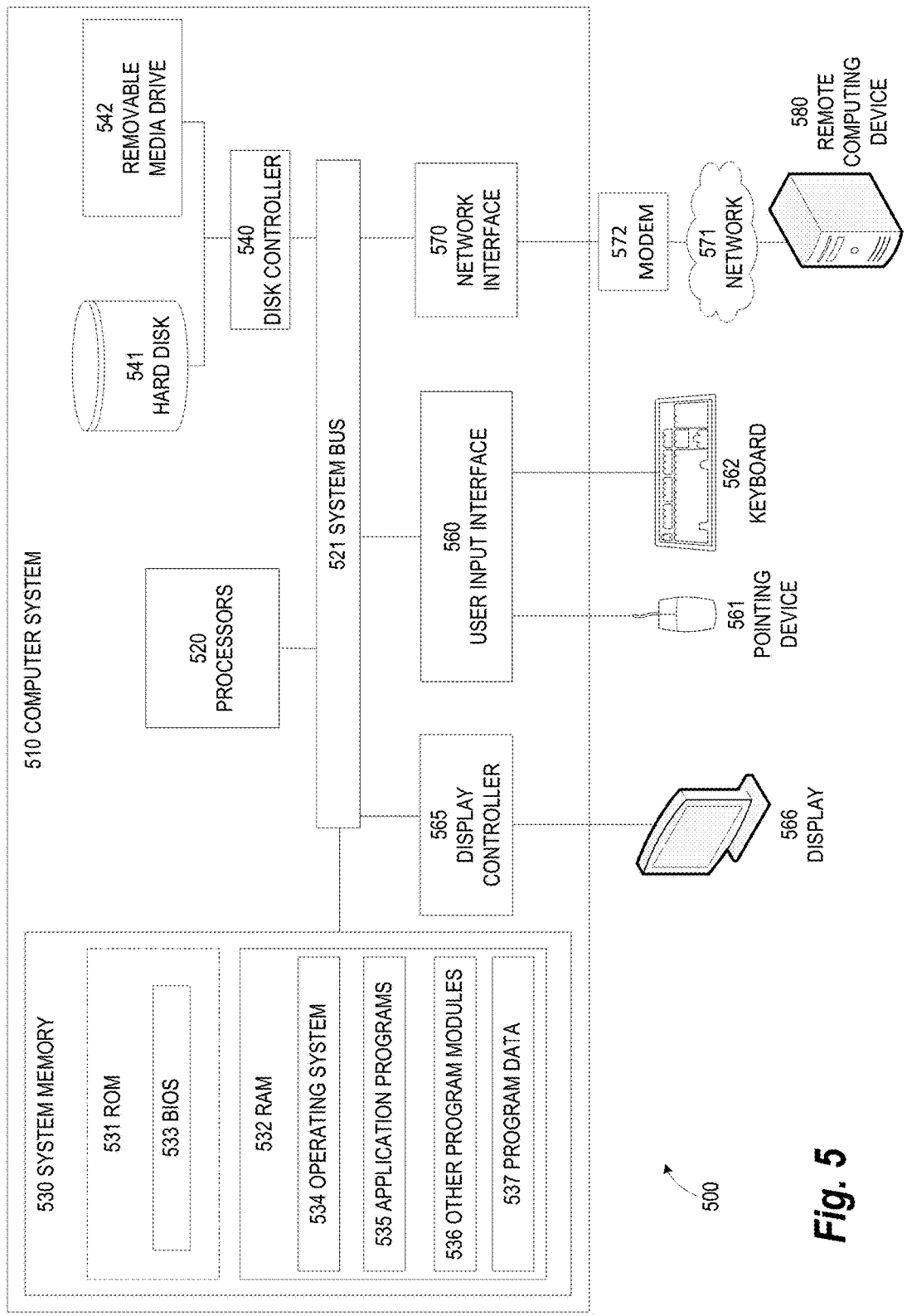
FIG. 5 illustrates an exemplary computing environment within which embodiments of the invention may be implemented.

FIG. 5 illustrates an exemplary computing environment 500 within which embodiments of the invention may be implemented. For example, this computing environment 500 may be used to implement the technique 400 described above with respect to FIG. 4. In some embodiments, the computing environment 500 may be used to implement one or more of the components illustrated in the system 100 of FIG. 1. The computing environment 500 may include computer system 510, which is one example of a computing system upon which embodiments of the invention may be implemented. Computers and computing environments, such as computer system 510 and computing environment 500, are known to those of skill in the art and thus are described briefly here.

As shown in FIG. 5, the computer system 510 may include a communication mechanism such as a bus 521 or other communication mechanism for communicating information within the computer system 510. The computer system 510 further includes one or more processors 520 coupled with the bus 521 for processing the information. The processors 520 may include one or more central processing units (CPUs), graphical processing units (GPUs), or any other processor known in the art.

The computer system 510 also includes a system memory 530 coupled to the bus 521 for storing information and instructions to be executed by processors 520. The system memory 530 may include computer readable storage media in the form of volatile and/or nonvolatile memory, such as read only memory (ROM) 531 and/or random access memory (RAM) 532. The system memory RAM 532 may include other dynamic storage device(s) (e.g., dynamic RAM, static RAM, and synchronous DRAM). The system memory ROM 531 may include other static storage device(s) (e.g., programmable ROM, erasable PROM, and electrically erasable PROM). In addition, the system memory 530 may be used for storing temporary variables or other intermediate information during the execution of instructions by the processors 520. A basic input/output system (BIOS) 533 containing the basic routines that help to transfer information between elements within computer system 510, such as during start-up, may be stored in ROM 531. RAM 532 may contain data and/or program modules that are immediately accessible to and/or presently being operated on by the processors 520. System memory 530 may additionally include, for example, operating system 534, application programs 535, other program modules 536 and program data 537.

The computer system 510 also includes a disk controller 540 coupled to the bus 521 to control one or more storage devices for storing information and instructions, such as a hard disk 541 and a removable media drive 542 (e.g., floppy disk drive, compact disc drive, tape drive, and/or solid state drive). The storage devices may be added to the computer system 510 using an appropriate device interface (e.g., a small computer system interface (SCSI), integrated device electronics (IDE), Universal Serial Bus (USB), or FireWire).

The computer system 510 may also include a display controller 565 coupled to the bus 521 to control a display 566, such as a cathode ray tube (CRT) or liquid crystal display (LCD), for displaying information to a computer user. The computer system includes an input interface 560 and one or more input devices, such as a keyboard 562 and a pointing device 561, for interacting with a computer user and providing information to the processors 520. The pointing device 561, for example, may be a mouse, a trackball, or a pointing stick for communicating direction information and command selections to the processors 520 and for controlling cursor movement on the display 566. The display 566 may provide a touch screen interface which allows input to supplement or replace the communication of direction information and command selections by the pointing device 561.

The computer system 510 may perform a portion or all of the processing steps of embodiments of the invention in response to the processors 520 executing one or more sequences of one or more instructions contained in a memory, such as the system memory 530. Such instructions may be read into the system memory 530 from another computer readable medium, such as a hard disk 541 or a removable media drive 542. The hard disk 541 may contain one or more datastores and data files used by embodiments of the present invention. Datastore contents and data files may be encrypted to improve security. The processors 520 may also be employed in a multi-processing arrangement to execute the one or more sequences of instructions contained in system memory 530. In alternative embodiments, hard-wired circuitry may be used in place of or in combination with software instructions. Thus, embodiments are not limited to any specific combination of hardware circuitry and software.

As stated above, the computer system 510 may include at least one computer readable medium or memory for holding instructions programmed according to embodiments of the invention and for containing data structures, tables, records, or other data described herein. The term "computer readable medium" as used herein refers to any medium that participates in providing instructions to the processor 520 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 541 or removable media drive 542. Non-limiting examples of volatile media include dynamic memory, such as system memory 530. Non-limiting examples of transmission media include coaxial cables, copper wire, and fiber optics, including the wires that make up the bus 521. Transmission media may also take the form of acoustic or light waves, such as those generated during radio wave and infrared data communications.

The computing environment 500 may further include the computer system 510 operating in a networked environment using logical connections to one or more remote computers, such as remote computer 580. Remote computer 580 may be a personal computer (laptop or desktop), a mobile device, a server, a router, a network PC, a peer device or other common network node, and typically includes many or all of the elements described above relative to computer system 510. When used in a networking environment, computer system 510 may include modem 572 for establishing communications over a network 571, such as the Internet. Modem 572 may be connected to bus 521 via user network interface 570, or via another appropriate mechanism.

Network 571 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 510 and other computers (e.g., remote computer 580). The network 571 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 571.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:
1. A method for increasing field of view (FOV) in magnetic resonance imaging, the method comprising:
   determining linear field gradients of associated with a gradient coil of a magnetic resonance (MR) scanner;
   using the MR scanner to acquire a k-space dataset representative of a patient using a plurality of readout gradient amplitudes;
   generating an extended FOV image based on the k-space dataset using an iterative reconstruction process that applies a forward model to convert the k-space data set to image space, wherein the forward model incorporates a measurement of gradient distortion as a deviation from the linear field gradients.

2. The method of claim 1, wherein the MR scanner acquires the k-space dataset using multiple projections of a non-Cartesian trajectory.

3. The method of claim 2, wherein the non-Cartesian trajectory is a spiral sampling trajectory.

4. The method of claim 2, wherein the non-Cartesian trajectory is a radial sampling trajectory.

5. The method of claim 1, wherein the linear field gradients of associated with the gradient coil of the MR scanner comprise a plurality of spatially varying functions.

6. The method of claim 1, wherein the iterative reconstruction process comprises a process implementing the Kaczmarz algorithm.

7. The method of claim 1, further comprising:
   generating a full body model of the patient based on the extended FOV image.

8. The method of claim 7, further comprising:
   using the full body model to perform a PET reconstruction of a patient image.

9. A system for increasing field of view (FOV) in magnetic resonance imaging, the system comprising:
   a plurality of coils configured to acquire a k-space dataset representative of a patient using a plurality of readout gradient amplitudes;
   a control computer configured to reconstruct an extended FOV image of the patient based on the k-space dataset using a process comprising:
      determining linear field gradients associated with the plurality of coils, and
      generating the extended FOV image based on the k-space dataset using an iterative reconstruction process that applies a forward model to convert the k-space data set from image space to projection space, wherein the forward model incorporates a measurement of gradient distortion as a deviation from the linear field gradients.

10. The system of claim 9, wherein the plurality of coils acquires the k-space dataset using multiple projections of a non-Cartesian trajectory.

11. The system of claim 10, wherein the non-Cartesian trajectory is a spiral sampling trajectory.

12. The system of claim 10, wherein the non-Cartesian trajectory is a radial sampling trajectory.

13. The system of claim 9, wherein the plurality of coils comprises volume coils.

14. The system of claim 9, wherein the plurality of coils comprise a phased array of coils and generation of the extended FOV image utilizes a plurality of sensitivity maps associated with the plurality of coils.

15. The system of claim 9, wherein the linear field gradients of associated with the plurality of coils comprise a plurality of spatially varying functions.

16. The system of claim 9, wherein the iterative reconstruction process implements the Kaczmarz algorithm.

17. The system of claim 9, further comprising:
a computer configured to generate a full body model of the patient based on the extended FOV image.

18. The system of claim 17, further comprising:
a positron emission tomography (PET) scanner configured to perform a PET acquisition of the patient using the full body model.

19. A system for performing extended FOV imaging, the system comprising:
a MRI scanner configured to acquire a k-space dataset representative of a patient using a plurality of readout gradient amplitudes;
one or more computers configured to:
generate an extended FOV image based on the k-space dataset using an iterative reconstruction process that applies a forward model to convert the k-space data set to image space, wherein the forward model incorporates a measurement of gradient distortion as a deviation from linear field gradients associated with the MRI scanner, and
generate a full body model of the patient based on the extended FOV image; and
a PET scanner configured to perform a PET acquisition of the patient using the full body model.

20. The system of claim 19, wherein the MRI scanner and the PET scanner are co-located in a single hybrid scanning device.

* * * * *